United States Patent [19]

Bloom et al.

[11] 4,084,970
[45] Apr. 18, 1978

[54] ORGANIC VOLUME PHASE HOLOGRAPHIC RECORDING MEDIA USING SUCROSE BENZOATE

[75] Inventors: Allen Bloom, East Windsor; Daniel Louis Ross, Princeton; Robert Alfred Bartolini, Trenton, all of N.J.; Ling Kong Hung, New York, N.Y.

[73] Assignee: RCA Corporation, New York, N.Y.

[21] Appl. No.: 661,813

[22] Filed: Feb. 27, 1976

Related U.S. Application Data

[63] Continuation of Ser. No. 498,771, Aug. 19, 1974, abandoned.

[51] Int. Cl.² .......................... G03C 1/00; G03C 5/04; G02B 3/00
[52] U.S. Cl. ...................................... 96/88; 96/27 H; 350/3.61
[58] Field of Search ................. 96/27 H, 88, 115 PL; 260/234 R; 350/3.5

[56] References Cited

U.S. PATENT DOCUMENTS

| 3,384,532 | 5/1968  | Martins et al. | 161/194  |
| 3,425,970 | 2/1969  | Segro et al.   | 260/17.3 |
| 3,495,998 | 2/1970  | Reeves et al.  | 160/176  |
| 3,547,509 | 12/1970 | Brandes        | 96/27 H  |
| 3,580,657 | 5/1971  | Sheridon       | 350/162  |
| 3,658,526 | 4/1972  | Haugh          | 96/27 H  |

FOREIGN PATENT DOCUMENTS 1,092,499  11/1967  United Kingdom.

Primary Examiner—David Klein
Assistant Examiner—L. Falasco
Attorney, Agent, or Firm—H. Christoffersen; Birgit E. Morris; Joseph T. Harcarik

[57] ABSTRACT

Organic holographic recording media comprise organic photosensitive compounds such as $\alpha$-diketones, quinones and nitro compounds in sucrose benzoate as host.

9 Claims, 1 Drawing Figure

U.S. Patent April 18, 1978 4,084,970
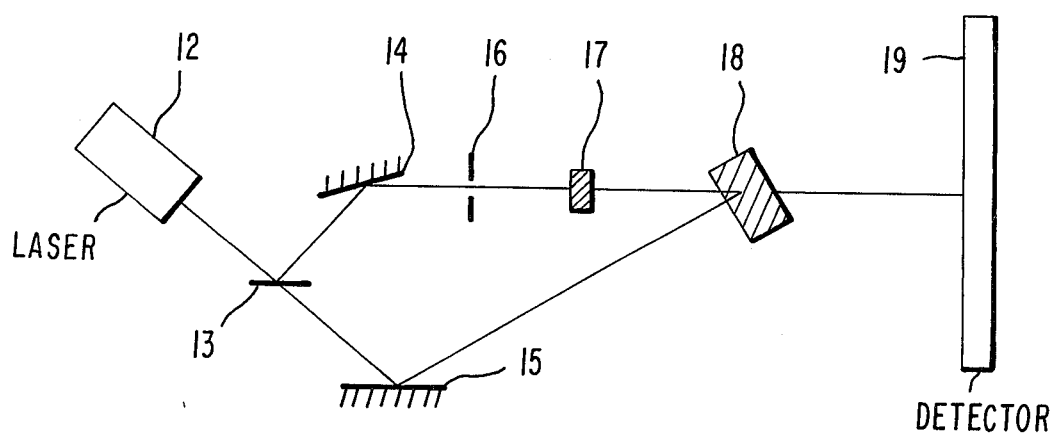

ORGANIC VOLUME PHASE HOLOGRAPHIC RECORDING MEDIA USING SUCROSE BENZOATE

This is a continuation of application Ser. No. 498,771 filed Aug. 19, 1974 abandoned.

This invention relates to novel holographic recording media. More particularly, this invention relates to holographic recording media comprising photosensitive organic compounds in solid sucrose benzoate as a host.

CROSS REFERENCES TO RELATED APPLICATIONS

This application discloses subject matter which is related to application Ser. No. 403,377 filed Oct. 4, 1973 by Ross now U.S. Pat. No. 3,951,663 and to application Ser. No. 403,408 filed Oct. 4, 1973 by Bartolini et al. now U.S. Pat. No. 3,926,718.

BACKGROUND OF THE INVENTION

Holographic recording media comprising certain photosensitive α-diketones dissolved in polymeric precursors which are curable to form transparent polymers are known and disclosed in the copending Ross application identified hereinabove. Suitable polymeric hosts include acrylic resins and epoxy resins which are cured and hardened by adding various catalysts or curing agents to the polymeric precursors. These holographic recording media have excellent sensitivity, and are relatively easy and inexpensive to make, generally by dissolving the photosensitive compound in the polymeric precursor and curing the polymer.

The Bartolini et al. application identified above discloses that α-diketones capable of hydrogen atom abstraction in a cured acrylic polyester host will record holographic information which can be stored permanently in the recording media.

Certain α-diketones, such as 2,2'-furil, cannot be employed as the photosensitive material in the recording media known heretofore because they are not soluble in the polymer precursors to any practicable extent. Other photosensitive materials, particularly those which are not α-diketones, such as quinones or nitro compounds, cannot be employed with host polymers which require catalysts or curing agents. Reactions between these photosensitive compounds and the catalysts or curing agents may degrade or inactivate the photosensitive material or inhibit the curing process of the polymer. Thus a host material which is a good solvent for photosensitive materials and which does not require catalysts or other curing agents to harden it to a transparent solid, would be most desirable.

SUMMARY OF THE INVENTION

We have discovered that a non-polymeric organic material, sucrose benzoate, is an excellent host material for use in organic holographic recording media. Sucrose benzoate is a hard, glassy, transparent solid at room temperature which can be polished to provide a material with excellent optical properties. In the molten state, above about 90°-93° C., sucrose benzoate dissolves many photosensitive organic compounds. The present holographic recording media have excellent mechanical and optical properties and high efficiency holograms can be recorded and/or stored therein.

BRIEF DESCRIPTION OF THE DRAWINGS

The FIGURE is a schematic diagram of an apparatus suitable for recording volume phase holograms.

DETAILED DESCRIPTION OF THE INVENTION

Photosensitive compounds suitable for use in the present holographic recording media are soluble in molten sucrose benzoate, and when illuminated by a spatially modulated coherent light beam having a wavelength corresponding to some absorption band of the photosensitive compound, the index of refraction of the medium changes in the illuminated area. Suitable photosensitive compounds include certain α-diketones, certain quinone compounds and certain nitro compounds, for example. The exact mechanism for the recording reaction is unknown at present, so that suitable compounds cannot be predicted in advance with certainty. However, certain classes of compounds have been identified as useful, including α-diketones, quinones and nitro compounds.

Illustrative of suitable α-diketones are aliphatic α-diketones such as
2,3-pentanedione,

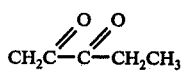

2,5-dimethyl-3,4-hexanedione,

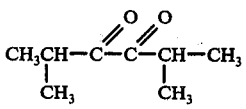

and the like;

cycloaliphatic α-diketones such as
camphorquinone,

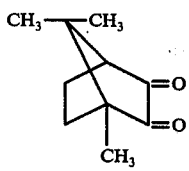

1,2,3,4-tetrachloro-1,4,4a,5,8,8a-hexahydro-1,4-ethano-5,8-methanonaphthalene-10,11-dione,

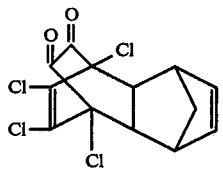

and the like;

aromatic α-diketones such as
benzil,

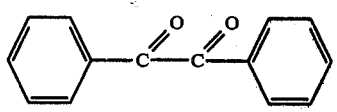

acenaphthenequinone

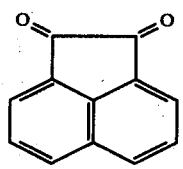 and the like;

4,4'-oxydibenzil,

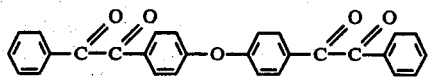

1,3-bis(phenylglyoxalyl)benzene,

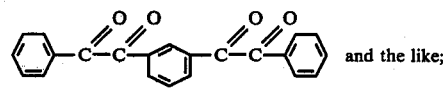 and the like;

and hetrocyclic α-diketones such as 2,2'-furil

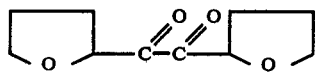 and the like;

Illustrative of suitable quinones are duroquinone,

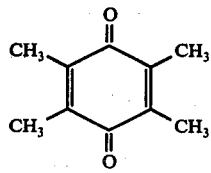

thymoquinone,

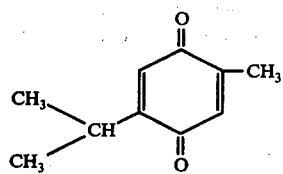

p-tetrafluorobenzoquinone,

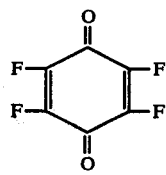

benz[a]anthracene-7,12-dione

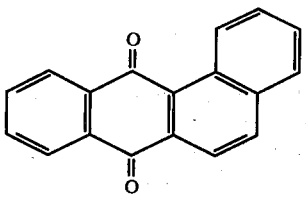 and the like;

Illustrative of suitable nitro compounds are β-bromo-β-nitrostyrene,

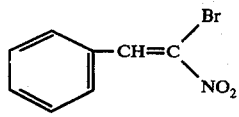

p-nitrobenzazide

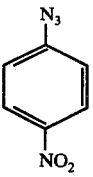 and the like.

The organic photosensitive compound must be soluble in molten sucrose benzoate in sufficient amount such that holograms can be recorded in the cooled recording medium.

The recording media as hereinabove described are prepared by heating sucrose benzoate above its melting point, dissolving the photosensitive compound in the desired amount and allowing the solution to cool to form clean solid castings of the shape and thickness desired. The castings can be polished after casting if desired. The sucrose benzoate can also be dissolved in an organic solvent in which the organic photosensitive compound is also soluble and the solution spun into thin films. For example sucrose benzoate is soluble in methyl ethyl ketone and a 5% by weight solution can be spun to form films from about 0.8 micron thick.

The choice and amount of organic photosensitive compound in sucrose benzoate will depend upon the type of storage media desired. In certain of the holographic recording media of the invention, recorded holograms are permanently fixed or stored. In this case, the photochemical reaction that occurs during recording must be an irreversible reaction resulting in a permanent hologram that can be read out with light of the same intensity employed for recording. Such recording media are suitable for long-term permanent storage of information and for high density recordings when many holograms can be recorded in a small volume of material merely by changing the recording angle as will be further described hereinbelow. Other organic photosensitive compounds produce media wherein the holograms decay and disappear after varying lengths of time and these will be useful for short term storage of information. Still others do not store holograms and these are erased during readout. These recording media will be useful when rapid updating of information is required.

The FIGURE is a schematic diagram of a system useful for recording and readout of holographic information in the recording media described above. Referring now to the FIGURE, this system includes a laser 12 which emits a coherent light beam. The light beam passes through a beam splitter 13. A portion of the beam is reflected from the beam splitter 13 onto a first mirror 14; the remainder of the light beam passes through onto the second mirror 15. The mirrors 14 and 15 are adjusted so that the plane polarized beams reflected from them meet at a predetermined angle, such as 30–45°. The portion of the beam reflected from the beam splitter 13 is the object beam. The object beam passes through a shutter 16 and then through the object to be recorded 17. The portion of the beam which passes through the beam splitter 13 is the reference beam. The recording medium 18 is positioned at the intersection of the reference and object beams. During readout, the shutter 16 is closed and only the reference beam passes through to the recording medium. The image can be viewed on a detector screen 19.

When more than one image is to be recorded in the recording medium, means for rotating or otherwise changing the selected portion of the recording medium exposed to the light beam is provided. During readout, means to rotate the recording medium or means to change the position or angle of the reference beam at the required angle of incidence will also be provided.

The invention will be further illustrated by the following example, but it is to be understood that the invention is not meant to be limited to the details described therein.

EXAMPLE

The general procedure for preparing the sample is as follows: 15 gram portions of sucrose benzoate were heated to melting. A stream of hot air from a heat gun was directed across the surface of the melt while swirling the melt to remove any entrapped air bubbles and then 0.75 gram of the photosensitive compound was stirred in to form a homogeneous solution. The procedure to remove entrapped air bubbles was then repeated. The solution was poured into polytetrafluoroethylene molds which had been sprayed with a silicone mold releasing agent (No. 5512 of IMS Company) and allowed to cool to a solid.

Holograms were recorded using laser light of various wavelengths which were matched to the absorption band wavelength of the organic compound. The results are tabulated below, wherein the samples of Group A recorded permanent holograms and those of Group B recorded information which decayed after a period of time.

TABLE I

| Samples | Photo-sensitive Compound | Concentration, % by Weight | Recording Wavelength, Angstroms | Sample Thickness, mm | Maximum Holographic Efficiency, Percent | Total Exposure Joules/cm$^2$ | Comments |
| --- | --- | --- | --- | --- | --- | --- | --- |
| GROUP A | | | | | | | |
| 1 | Camphorquinone | 5 | 5145 | 6 | 70 | 1000 | Fixed at 35% efficiency after 1 mo. |
| 2 | 1,3-bis(phenyl-glyoxalyl)benzene | 2 | 4880 | 7.9 | <1 | 400 | Fixed after one week |
| 3 | duroquinone | 5 | 5145 | 10 | <1 | 400 | Fixed after one week |
| 4 | thymoquinone | 0.25 | 5145 | 6.3 | 5 | 400 | Fixed after one week |
| 5 | p-tetrafluoro-benzoquinone | 2 | 5145 | 8.5 | <1 | 400 | Fixed after two weeks |
| 6 | acenaphthene-quinone | 1 | 5145 | 7 | 1.7 | 50 | Fixed after six months |
| GROUP B | | | | | | | |
| 7 | 2,3-pentane-dione | 5 | 4880 | 6 | 60 | 200 | Efficiency rapidly drops to zero |
| 8 | 2,5-dimethyl-3,4-hexanedione | 2 | 4880 | 7.65 | 50 | 100 | Efficiency 25% after one week |
| 9 | | 5 | 4880 | 7.3 | 75 | 60 | Efficiency drops to zero after 3 weeks |
| 10 | 1,2,3,4-tetra-chloro-1,4,4a,5,8,8a-hexa-hydro-1,4-ethano- | 1 | 4880 | 7 | 5 | 20 | Efficiency rapidly drops to zero |
| 11 | 5,8-methanonaph-thalene-10,11-dione | 1 | 5145 | 7 | 3 | 200 | |
| 12 | benzil | 2 | 4880 | 7.9 | 1 | 600 | Efficiency drops to zero after three days |
| 13 | | 5 | " | 8.5 | 1 | 400 | |
| 14 | 4,4'-oxydibenzil | 3 | 4880 | 3.4 | 5 | 500 | Efficiency rapidly drops to zero |
| 15 | 2,2'-furil | 2 | 5145 | 9.3 | <1 | 300 | Efficiency drops to zero in one day |
| 16 | benz[a]anthra-cene-7,12-dione | 1 | 5145 | 6.5 | <1 | 500 | Efficiency rapidly drops to zero |
| 17 | β-bromo-β-nitro-styrene | 5 | 4880 | 8.75 | 5 | 300 | Efficiency drops to zero in three days |
| 18 | p-nitrobenzazide | 1 | 5145 | 7.8 | <1 | 400 | Efficiency drops to zero after three weeks |

We claim:

1. A holographic recording medium comprising a host material containing a photosensitive organic compound, said host material consisting essentially of sucrose benzoate wherein said sucrose benzoate is a hard, glassy, transparent solid at room temperature, said organic compound being present in an amount sufficient to cause a change in the index of refraction in the medium when illuminated by a spatially modulated coherent light beam having a wavelength corresponding to some absorption band of the photosensitive compound.

2. A holographic recording medium according to claim 1 wherein the photosensitive compound is an α-diketone.

3. A holographic recording medium according to claim 1 wherein the photosensitive compound is a quinone.

4. A holographic recording medium according to claim 1 wherein the photosensitive compound is a nitro compound.

5. A holographic recording medium according to claim 2 wherein the α-diketone is camphorquinone.

6. A holographic recording medium according to claim 2 wherein the α-diketone is 2,3-pentanedione.

7. A holographic recording medium according to claim 2 wherein the α-diketone is 2,5-dimethyl-3,4-hexanedione.

8. A holographic recording medium according to claim 1 wherein the photosensitive compound is capable of intermolecular hydrogen atom abstraction with the sucrose benzoate.

9. In the method for recording holograms which comprises changing the refractive index in a recording medium with modulated coherent light and detecting the refractive index changes, the improvement which comprises using as the recording medium a host material containing a photosensitive organic compound, said host material consisting essentially of sucrose benzoate wherein said sucrose benzoate is a hard, glassy, transparent solid at room temperature, said organic compound being present in an amount sufficient to cause a change in the index of refraction in the medium when illuminated by a spatially modulated coherent light beam.

* * * * *